(12) United States Patent
Ivkovich, Jr. et al.

(10) Patent No.: US 7,473,331 B2
(45) Date of Patent: Jan. 6, 2009

(54) METHOD OF APPLYING AN OPTICAL COATING TO AN ARTICLE SURFACE

(75) Inventors: Daniel Peter Ivkovich, Jr., Fairfield, OH (US); Andrew Jay Skoog, West Chester, OH (US); Jane Ann Murphy, Franklin, OH (US); Thomas Walter Rentz, Cincinnati, OH (US); William Randolph Stowell, Rising Sun, IN (US); Bryan Thomas Bojanowski, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 744 days.

(21) Appl. No.: 10/681,676

(22) Filed: Oct. 8, 2003

(65) Prior Publication Data

US 2005/0079284 A1   Apr. 14, 2005

(51) Int. Cl.
*B44C 1/175*     (2006.01)
*B29C 65/02*     (2006.01)
*B29C 65/56*     (2006.01)
*B29C 33/58*     (2006.01)
*B32B 37/06*     (2006.01)
*B32B 37/10*     (2006.01)
*B29C 65/48*     (2006.01)
*B29C 33/72*     (2006.01)
*B29C 33/74*     (2006.01)
*B32B 37/22*     (2006.01)

(52) U.S. Cl. .................... 156/236; 156/230; 156/235; 156/289; 156/344

(58) Field of Classification Search .............. 156/230, 156/236, 247, 289, 344, 235
See application file for complete search history.

(56) References Cited

U.S. PATENT DOCUMENTS

| 3,654,016 | A | * | 4/1972 | Alexander | 156/247 |
| 3,925,138 | A | * | 12/1975 | Shaul et al. | 156/313 |
| 4,407,685 | A | * | 10/1983 | Hankland | 156/212 |
| 4,481,999 | A | * | 11/1984 | Duchane et al. | 164/6 |
| 4,623,087 | A | * | 11/1986 | Conolly | 228/176 |
| 5,830,529 | A | * | 11/1998 | Ross | 427/152 |
| 5,989,377 | A | * | 11/1999 | Wilheim et al. | 156/230 |
| 6,049,419 | A | | 4/2000 | Wheatley et al. | |
| 6,165,600 | A | | 12/2000 | Ivkovich, Jr. et al. | |
| 2005/0100665 | A1 | * | 5/2005 | Ivkovich et al. | 427/162 |
| 2006/0237124 | A1 | * | 10/2006 | Bartoli et al. | 156/247 |

FOREIGN PATENT DOCUMENTS

GB    2289866 A  *  12/1995

* cited by examiner

*Primary Examiner*—Philip C Tucker
*Assistant Examiner*—Sonya Mazumdar
(74) *Attorney, Agent, or Firm*—McNees Wallace & Nurick, LLC

(57) ABSTRACT

An optical coating is applied to an article surface of an article by applying a first release system to a deposition substrate, and depositing the optical coating onto the deposition substrate. A second release system and transfer substrate is applied to the second face of the optical coating. The first release system is dissolvable in a first-release-coating solvent that does not dissolve the second release system. The first release system is dissolved in the first-release-coating solvent that does not dissolve the second release system, to separate the optical coating from the deposition substrate. The first face of the optical coating is affixed to the article surface, and the transfer substrate is separated from the optical coating. Any of a variety of affixing techniques may be used.

17 Claims, 2 Drawing Sheets

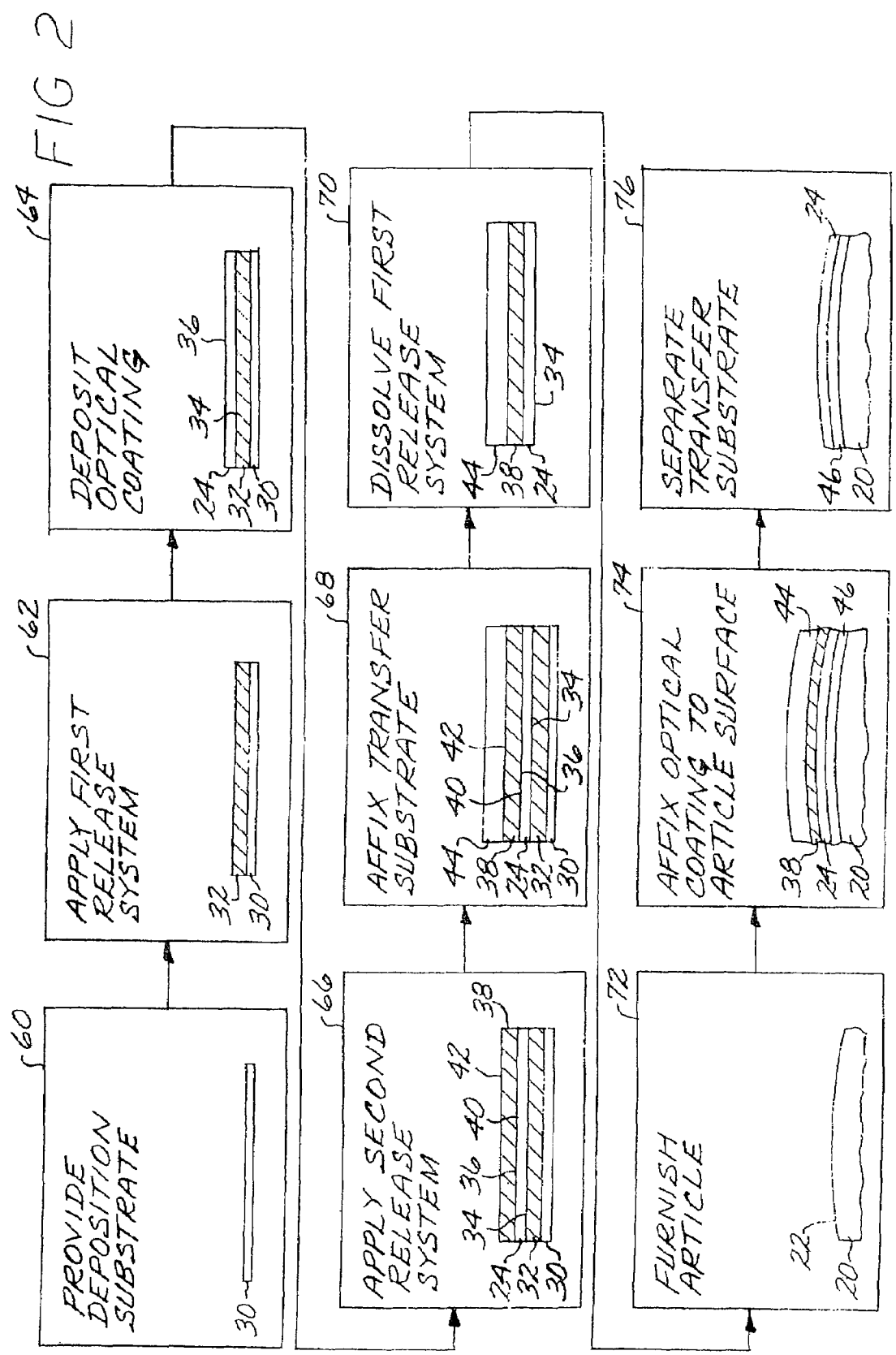

METHOD OF APPLYING AN OPTICAL COATING TO AN ARTICLE SURFACE

This invention relates to optical coatings that are applied to article surfaces to alter their optical properties and, more particularly, to heat-rejecting coatings that reflect infrared energy.

BACKGROUND OF THE INVENTION

Some article components of gas turbine engines operate in a high-temperature environment produced by the combustion gases of the engine. Ever higher operating temperatures are sought to improve the thermodynamic efficiency of the engine. In order to operate at high temperatures, the components are made of materials that retain the required mechanical properties at such temperatures. Even with the use of advanced materials such as superalloys, in some cases the capabilities of the materials are pushed to their limits, so that the operating temperature cannot be increased further.

Another approach is to create conditions in which the component operates cooler than it might otherwise, in the same high-temperature environment. One technique is to cool the component with a flow of cool air. Another technique is to coat the component with a ceramic thermal barrier coating that insulates the underlying metallic material from the hot combustion gases.

Yet another technique is to apply a heat-reflective coating, either a noble-metal layer or an optical coating, to the surface of the component to reflect an external heat load away from the component. That is, the heat energy radiated by the hot combustion gas and other hot components continues to be incident upon the coated component, but a fraction of the heat energy is reflected away from the component by the heat-reflective coating. The heat-reflective coating serves as a "heat mirror" to reflect heat from the surface in a manner somewhat analogous to a familiar light mirror that reflects light away from a surface. The noble-metal coating has limitations on its maximum use temperature due to diffusion and chemical interaction with some superalloys.

The optical coating typically has a multilayer structure with a number of coating layers. The materials of the optical coating are selected to withstand the required operating temperature. Radiated heat energy is largely transmitted in the high-visible and near-infrared wavelength ranges having wavelengths of about 0.5-3 micrometers. The thicknesses of the various layers are tailored to reflect the various optical infrared wavelengths that carry the heat energy in this particular circumstance. The thicknesses of the layers are usually small, with each layer of a 3-90 layer stack being on the order of about 0.005-25 micrometers thick. Techniques for designing such optical coatings are well known.

To apply an optical coating to the surface of an article, the article is placed into a deposition apparatus appropriate for the type of optical coating to be deposited. Typical application techniques include chemical vapor deposition (CVD) and physical vapor deposition (PVD), each of which requires a specialized deposition apparatus. The component article is placed into the deposition apparatus and processed to deposit the optical coating. CVD has limitations on equipment size, and PVD is a line-of-sight deposition technique.

While this deposition approach is operable, the work leading to the present approach has identified some significant process limitations in practical applications. The deposition apparatus must be made sufficiently large to accommodate the article upon which the optical coating is to be applied, and in many cases special deposition apparatus must be built for very large articles. The capital and operating costs for the special deposition apparatus are high. To achieve the maximum production economies, the deposition apparatus is desirably made sufficiently large to accommodate a number of the articles. The article surface upon which the optical coating is to be applied may have an irregular geometry, so that the deposition of the optical coatings, with precisely defined compositions and thicknesses, over the entire article surface is difficult.

These limitations present challenges at the original manufacturing facility where the new-make article is made, but even greater challenges for repair operations. Most repair operations are performed at sites away from the original manufacturing facility, so that any improvements to the deposition apparatus used to deposit the optical coating must be duplicated, and process improvements implemented, at the remote repair site, in order to repair the optical coatings. The high costs of the available approaches for providing the coatings inhibit the installation of the required apparatus at the remote repair sites.

The result of these limitations is that, although optical coatings offer important benefits, their use is limited by the manufacturing difficulties that are encountered in both new-make and repair applications of the optical coatings. There is a need for an approach to applying optical coatings that is economically applicable for both new-make and repair. The present invention fulfills this need, and further provides related advantages.

SUMMARY OF THE INVENTION

The present invention provides a method for applying an optical coating to a surface of an article. The approach allows the optical coating to be deposited largely without any limit on the size of the article or the shape of the article. The approach also allows the deposition apparatus to be used efficiently, by maximizing the utilization of the volume within the deposition apparatus. In most cases, larger deposition apparatus is not required in order to protect a large number of components with the optical coating. The deposition is accomplished with high precision, so that precisely defined compositions and thicknesses of the layers are achieved regardless of the geometry of the article surface. The present approach is not dependent upon line-of-sight deposition relative to the ultimate substrate surface. The present approach allows repair procedures at remote sites to be performed with essentially the same processing procedures as used at the original manufacturing facility. In the case of most interest, the aircraft-engine application, remote repairs may be performed with the engine removed from the aircraft or, in some cases, while the engine remains installed on the aircraft.

Generally, a method for applying an optical coating to an article surface of an article involves depositing the optical coating onto a deposition substrate separate from the article surface, and thereafter transferring the optical coating from the deposition substrate to the article surface.

More specifically, a method for applying an optical coating to an article surface of an article comprises the steps of providing a deposition substrate, thereafter applying a first release system to the deposition substrate, and thereafter depositing the optical coating onto the deposition substrate, with the first release system between the optical coating and the deposition substrate. The optical coating has a first face contacting the first release system, and a second face remote from the first face. The method includes applying a second release system and transfer substrate to the second face of the optical coating. The first release system is dissolvable in a first-release-coating solvent that does not dissolve the second release system. The method further includes thereafter dissolving the first release system in the first-release-coating solvent to separate the optical coating from the deposition substrate. The first face of the optical coating becomes an exposed free face. The article having the article surface is furnished, and thereafter the first face of the optical coating is affixed to the article surface. The transfer substrate is thereafter separated from the second face of the optical coating.

The step of applying the second release system and transfer substrate may be accomplished by any operable approach. In one approach, the step of applying the second release system and transfer substrate includes the step of providing a single release-and-transfer structure having the second release system integrated with the transfer substrate. The single release-and-transfer structure may be, for example, a polymeric releasable adhesive tape such as polytetrafluoroethylene tape.

In another approach to applying the second release system and transfer substrate, a second release system is applied to the second face of the optical coating. The second release system has a first face contacting the second face of the optical coating, and a second face remote from the first face. The first release system is dissolvable in a first-release-coating solvent that does not dissolve the second release system. A transfer substrate is thereafter affixed to the second face of the optical coating, with the second release system between the transfer substrate and the second face of the optical coating. In this embodiment, the second release layer is, for example, a wax, a releasable adhesive, or the like. The transfer substrate is preferably a compliant material such as a castable silicone rubber.

In a preferred approach, the deposition substrate is an organic deposition substrate such as an organic polyimide deposition substrate. The first release system is an aluminum layer. The optical coating is a multilayer coating such as Si/SiO, $SiO_2/TiO_2$, or $SiO_2/Ta_2O_5$, applied in multiple repetitions. The use of the transfer substrate allows the optical coating to be applied to curved surfaces and retain its functionality. Even though the layers of the multilayer coating may crack when bent to conform to a curved surface, they are retained in place by the transfer substrate until affixed to the article surface, and retain their heat-reflectivity in service.

The article to which the optical coating is applied may be a component of a gas turbine engine, an application of particular interest. The article may be a new-make article that has not previously been in service, or an article which has previously been in service and is being repaired and/or refurbished. The present approach has the particular advantage that the steps prior to affixing the optical coating to the article surface may be performed at a central location, and the assembly of the optical coating on the transfer substrate thereafter moved to a remote location for affixing to the article surface.

The step of affixing the first face may include positioning a bonding element between the first face of the optical coating and the article surface, and pressing the bonding element, the first face, and the article surface together at an elevated temperature. This affixing may be accomplished by bonding the bonding element to the article surface, and thereafter bonding the first face of the optical coating to the bonding element. Alternatively, the first face of the optical coating may be bonded to the bonding element, and thereafter the bonding element is bonded to the article surface.

The present approach allows the optical coating to be prepared separately from the article and its article surface, on a deposition substrate. This deposition on the deposition substrate is accomplished in a conventionally sized deposition apparatus, which is not modified regardless of the size of the article. Many deposition substrates with optical coatings thereon may be prepared in a highly controlled manner, with precisely defined compositions and thicknesses of the layers of the optical coating. The space within the deposition apparatus is used efficiently as well. After the deposition substrate with the optical coating thereon is prepared, it is transferred via the transfer substrate to the article surface. The transfer substrate with the optical coating thereon may be prepared at a central facility under carefully controlled conditions, and then shipped to remote facilities such as repair facilities for affixing to the article surface. The deposition apparatus and processing therefore need not be duplicated at the repair facilities, an important economic and technical advantage. With this approach, the article to which the optical coating is applied is never placed into any deposition apparatus. The only apparatus that need be sized for the article in some embodiments is a heating-and-pressuring device, such as an autoclave. Large autoclaves are widely available, unlike large deposition apparatus. In some instances, the heating and pressure application may be performed with a vacuum bag and a local heat source, or an iron-on technique.

Another advantage of the present approach is that the optical coating may be implemented by preparing standardized pieces or tiles of the optical coating on the transfer substrate pieces at a central location, and then applying the standardized pieces to the article to be protected at the central location or at remote sites. For example, standard 2 inch by 2 inch (and/or larger and/or smaller) pieces with the optical coating on the transfer substrate may be prepared. The pieces may be prepared in regular geometric patterns that cover a surface when applied in a tile-like fashion, such as triangles, squares, or hexagons. The pieces may instead have custom shapes. These pieces are then taken to the location where the coating is to be applied and affixed to the article surface by the approaches discussed herein. Other pieces may be cut to a required size and shape from a larger, standard piece. The pieces are applied in the manner of a plurality of tiles or a mosaic to the surface, making the handling easier as compared with a single large piece of optical coating/transfer substrate. The tiling approach also facilitates the application to curved or otherwise irregular article surfaces.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 2 is a block flow diagram of an approach for preparing an article having the optical coating thereon, with the structure schematically illustrated at each stage.

DETAILED DESCRIPTION OF THE INVENTION

Figure 1:
FIG. 1 is a schematic sectional view of a component of a gas turbine engine with an optical coating thereon.

FIG. 1 depicts a component of a gas turbine engine, such as a combustor liner of a commercial high-by-pass turbofan gas turbine engine, that serves as an article 20 having an article surface 22. An optical coating 24 is deposited upon the article surface 22. In conventional practice as depicted in FIG. 1, the component is placed into a deposition apparatus that is appropriate for the type of optical coating 24 being deposited, and the optical coating 24 is deposited directly onto the article surface 22 in the deposition apparatus. However, such deposition is difficult or impossible in some cases, such as complexly shaped surfaces, large articles with large surfaces, and the like.

Figure 3:
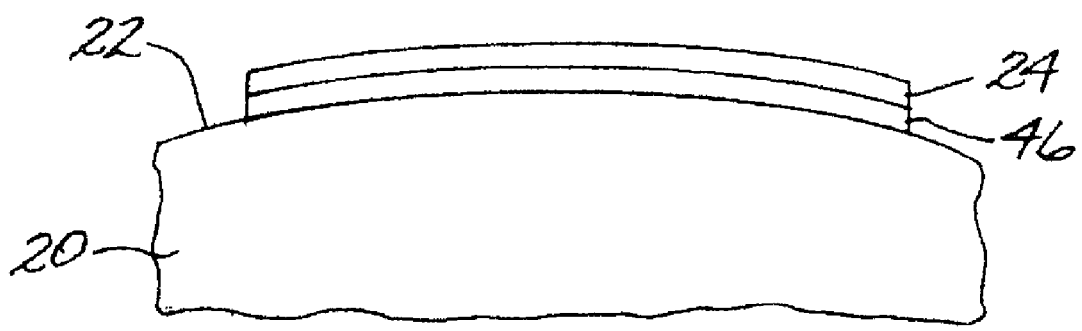
FIG. 3 is a schematic sectional view of an article with an optical coating affixed to the article surface.

The present approach utilizes a different approach to the application of the optical coating 24 onto the article 20. FIG. 2 is a pictorial block flow diagram of the present approach, with the structure at each stage depicted schematically, and FIG. 3 depicts the article with the optical coating affixed thereto.

A method for applying an optical coating 24 to the article surface 22 of the article 20 includes first providing a deposition substrate 30, step 60, which is subsequently sacrificed during the processing. The deposition substrate 30 is preferably made of an organic film material such as a polyimide film. Kapton® polyimide polymer film is preferred as the deposition substrate 30. The deposition substrate 30 is most preferably a thin sheet of the polyimide, typically from about 0.001 to about 0.015 inches thick.

A first release system 32 is thereafter applied to the deposition substrate 30, step 62. The first release system 32 is preferably a layer of a metal, such as aluminum, deposited onto the deposition substrate 30. The aluminum first release system 32 is preferably from about 0.5 to about 20 micrometers thick. The deposition of aluminum onto polyimide material is well known and widely practiced in the art for other applications. Other first release systems 32 include, for example, other metals, organic salts, and inorganic salts.

The optical coating 24 is thereafter deposited onto the deposition substrate 30, step 64, with the first release system 32 between the optical coating 24 and the deposition substrate 30. The optical coating 24 has a first face 34 contacting the first release system 32, and a second face 36 remote from the first face 34.

The optical coating 24 may be of any operable type. Optical coatings 24 are available from a number of commercial manufacturers for other applications. Such optical coatings 24 are typically multilayer structures of alternating related compositions with different indices of refraction for the wavelengths of interest. The optical coating may be a single-layer structure, such as a noble-metal heat-rejection coating, in some cases. For the heat-reflective optical coatings 24, the wavelengths of interest are typically in the range of about 0.5-3.0 micrometers, depending upon the wavelengths of the radiation that is transmitting the heat. Examples of optical coatings 24 include multiple alternating layers of Si and SiO for operational temperatures up to about 1200° F., and multiple alternating layers of $SiO_2$ and $Ta_2O_5$ for operational temperatures above about 1200° F. Computer programs are available to design the optical coatings 24 for any application of interest. Example are the commercially available Filmstar® and TF Calc programs. The deposition of the optical coating 24 is accomplished by any appropriate deposition technique, with examples being chemical vapor deposition (CVD) and physical vapor deposition (PVD) or sputtering. The various techniques for depositing optical coatings 24 all require special deposition apparatus that is expensive to construct and operate. In the present approach, the deposition apparatus is preferably located at a central manufacturing site, and is of a standard size and configuration. Different deposition apparatus for different applications, and for differently sized and shaped articles, is not required. The specific materials of construction, layer thicknesses, and numbers of layers in the optical coating 24, and the deposition procedure, are selected according to each specific application, and are not a part of the present invention.

A second release system 38 is thereafter applied to the second face 36 of the optical coating 24, step 66. The second release system 38 has a first face 40 contacting the second face 36 of the optical coating 24, and a second face 42 remote from the first face 40. The first release system 32 and the second release system 38 are selected so that the first release system 32 is dissolvable in a first-release-coating solvent that does not dissolve the second release system 38. For the preferred case where the first release system 32 is aluminum, the second release system 38 is preferably a paste wax, a releasable adhesive, or a spray release material such as MS122 spray release material. Many types of materials work well for the second release system 38.

A transfer substrate 44 is thereafter affixed to the second face 42 of the second release system 38, step 68, with the second release system 38 between the transfer substrate 44 and the second face 36 of the optical coating 24. That is, the transfer substrate 44 is deposited upon the second face 42 of the second release system 38, whose first face 40 contacts the optical coating 24. The transfer substrate 44 is preferably a compliant material such as a castable elastomer that may be prepared and cast in a flowable form and then hardened. A most preferred material for the transfer substrate 44 is a castable silicone (although a stand-alone piece of a silicone or other material may instead be used). An example of a commercially available castable silicone is GE RTV664 silicone. Other castable or stand-alone organic materials may be used as well.

The two steps 66 and 68 may be performed sequentially with a discrete second release system 38 and a discrete transfer substrate 44. The two steps 66 and 68 may instead be performed, and preferably are performed, using a single integral second release system and transfer substrate that is used instead of the elements 38 and 44, and is applied to the second face 36 of the optical coating 24. As in the discrete element embodiment, the first release system is dissolvable in a first-release-coating solvent that does not dissolve the second release system. A preferred single release-and-transfer structure is polytetrafluoroethylene (3M Teflon™) tape. Such a releasable adhesive tape performs both the second release function and also the transfer substrate function.

The first release system 32 is thereafter dissolved in the first-release-coating solvent to separate the optical coating 24 from the deposition substrate 30, step 70. In the case of the preferred aluminum first release system 32, the first-release-coating solvent is preferably a mixture of 40 milliliters of 36-38 percent concentration HCl, 40 grams of copper sulfate, and 40 milliliters of water. This solvent attacks and dissolves the aluminum of the first release system 32, so that the deposition substrate 30 separates. The solvent does not attack the optical coating 24, the second release system 38, and the transfer substrate 44, leaving them as an integral unit. With the removal of the first release system 32, the first face 34 of the optical coating 24 becomes an exposed free face.

The article 20 having the article surface 22 is furnished, step 72. The article 20 of most interest is a component of a gas turbine engine, such as a combustor liner. The article 20 may be a newly made article, or an article that has previously been in service and is to be repaired. In the latter case, any remnants of previously existing optical coatings, and other coatings and films, are first removed, and the article surface 22 is carefully cleaned at this point.

The first face 34 of the optical coating 24, prepared in steps 60-70, is thereafter affixed to the article surface 24, step 74, using a bonding material. The affixing step 74 preferably includes furnishing a bonding element 46, positioning the bonding element 46 between the first face 34 of the optical coating 24 and the article surface 22, and pressing the bonding element 46, the first face 34, and the article surface 24 together at an elevated temperature. The bonding element 46 is selected so that its presence has no adverse impact, and in fact desirably is beneficial to the performance of, the article 20 and the optical coating 24. The preferred bonding element 46 is a multilayer tape (MLT) such as that described in U.S. Pat. No. 6,165,600, whose disclosure is incorporated by reference. In the preferred multilayer tape, an upper layer about 0.005 inches thick is of a finer aluminosilicate material, and a bottom layer about 0.015 inches thick is of a coarser aluminosilicate material. The pressing may be accomplished using an autoclave, with the elements enclosed in a vacuum bag or the like, as described in the '600 patent. This process bonds the bonding element 46 to both the article surface 22 and to the first face 34 of the optical coating 24.

An advantage of the present approach is that the affixing step 74 may be accomplished in various substeps that are selected to be particularly suitable for various circumstances. For example, the first face 34 of the optical coating 24 may be first bonded to the bonding element 46, and thereafter the bonding element 46 is bonded to the article surface 22. This approach is particularly useful to support the logistics of repair operations, since the preceding steps 60-70 and the bonding of the first face 34 to the bonding element 46 in step 74 may be accomplished at the central manufacturing facility, the bonded structure is shipped to the repair facility, and the affixing of the bonding element 46 to the article surface 22 is performed at the repair facility. The bonding may be accomplished with the engine removed from the aircraft, or while the engine remains installed to the aircraft in some instances. In an alternative approach, the bonding element 46 is first bonded to the article surface 22, and thereafter the first face 34 of the optical coating 24 is bonded to the bonding element 46. In yet another approach, the elements 20 and 46, and the subassembly 24, 38, and 44, are stacked together and simultaneously bonded.

Another advantage of the present approach is that the pressing and heating of the affixing step 74 may be accomplished by any operable approach, and that a wide variety of methods may be used. For example, the pressing and heating may be accomplished in an autoclave. The pressing and heating may be accomplished with a vacuum bag and a heating source that encloses the entire article being coated. The pressing and heating may be accomplished with a vacuum bag and a heating source that process a limited area of the surface of the article in each application. Thus, the article may be enclosed in the vacuum bag, and locally heated with a heat gun. In yet another variation, the optical coating 24 attached to the transfer substrate 44 may be ironed onto the article surface 22. In all of these approaches, some of the heating may be accomplished in-situ by the heating of the article in service, after an initial partial bonding is performed before or upon the first placement of the article into service.

The transfer substrate 44 is separated from the optical coating 24, step 76. This separation step 76 may be accomplished either simultaneously with step 74 or subsequent to step 74. If the second release system 38 is volatile at the temperature reached in the affixing step 74, the separation step 76 occurs simultaneously with the step 74. If the second release system 38 is not volatile at this temperature, it may be dissolved away with a suitable second-release-coating solvent or peeled away from the optical coating, as demonstrated with Teflon™ tape, as the separate, subsequent step 76.

FIG. 3 depicts the resulting structure. The optical coating 24 is affixed to the article surface 22 by the bonding element 46. The structure is therefore different than that depicted in the conventional approach of FIG. 1, due to the presence of the bonding element 46. As noted, the bonding element 46 is selected so that its presence does not have an adverse influence on the properties of either the optical coating 24 or the article 20.

The present approach may be utilized to apply optical coatings in a wide variety of applications, and several applications are discussed next. In one embodiment, the optical coating is applied to a substrate that already has a thermal barrier coating thereon. That is, the new-make or repaired article 20 is a substrate with a thermal barrier coating thereon. In a second embodiment, the article 20 is a new-make or repaired Ceramic Matrix Composite substrate. In a third embodiment, the article 20 is a new-make or repaired coated metal substrate. In a fourth embodiment, the article 20 is a metal substrate with no coating thereon. In a fifth embodiment, the article 20 is a metal substrate with an environmental or bond coat thereon.

The method of the invention, as discussed in relation to FIG. 2, has been demonstrated on 2 inch by 2 inch flat test specimens.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for applying an optical coating to an article surface of an article, comprising the steps of:

providing a polyimide film as a deposition substrate; thereafter applying an aluminum layer as a first release system to the deposition substrate; thereafter depositing the optical coating as a multi-layer coating onto the deposition substrate, with the first release system between the optical coating and the deposition substrate, wherein the optical coating has a first face contacting the first release system, and a second face remote from the first face; thereafter applying a second release system and a transfer substrate to the second face of the optical coating, wherein the first release system is dissolvable in a first-release-coating solvent that does not dissolve the second release system, the first-release-coating solvent comprising water, hydrochloric acid and copper sulfate; thereafter dissolving the first release system in the first-release-coating solvent to separate the optical coating from the deposition substrate, wherein the first face of the optical coating becomes an exposed free face; thereafter furnishing the article having the article surface; thereafter affixing the first face of the optical coating to the article surface; and thereafter separating the transfer substrate from the second face of the optical coating, wherein the optical coating includes alternating layers of Si and SiO, or alternating layers of $SiO_2$ and $Ta_2O_5$.

2. The method of claim 1, wherein the step of applying a second release system and transfer substrate includes the step of providing a compliant transfer substrate.

3. The method of claim 1, wherein the step of applying a second release system and transfer substrate includes the step of providing a castable transfer substrate.

4. The method of claim 1, wherein the step of applying the second release system and transfer substrate includes the steps of applying the second release system to the second face of the optical coating, wherein the second release system has a first face contacting the second face of the optical coating, and a second face remote from the first face, and thereafter affixing the transfer substrate to the second face of the optical coating, with the second release system between the transfer substrate and the second face of the optical coating.

5. The method of claim 1, wherein the step of applying the second release system and transfer substrate includes the step of providing a release-and-transfer structure having the second release system integrated with the transfer substrate.

6. The method of claim 1, wherein the step of applying the second release system and transfer substrate includes the step of providing a release-and-transfer structure having the second release system integrated with the transfer substrate, wherein the release-and-transfer structure is a polymeric releasable adhesive tape.

7. The method of claim 1, wherein the step of furnishing the article includes the step of
furnishing the article that is a component of a gas turbine engine.

8. The method of claim 1, wherein the step of furnishing the article includes the step of
furnishing a new-make article.

9. The method of claim 1, wherein the step of furnishing the article includes the step of
furnishing an article which has previously been in service.

10. The method of claim 1, wherein the step of affixing the first face includes the step of
positioning a bonding element between the first face of the optical coating and the article surface, and
pressing the bonding element, the first face, and the article surface together at an elevated temperature.

11. The method of claim 1, wherein the step of affixing the first face includes the step of
bonding a bonding element to the article surface, and thereafter
bonding the first face of the optical coating to the bonding element.

12. The method of claim 1, wherein the step of affixing the first face of the optical coating to the article surface includes the step of
bonding the first face of the optical coating to a bonding element, and thereafter
bonding the bonding element to the article surface.

13. The method of claim 1, wherein the step of affixing the first face includes the step of
heating and pressing the first face using an autoclave.

14. The method of claim 1, wherein the step of affixing the first face includes the step of
heating and pressing the first face using a vacuum bag and a general heat source.

15. The method of claim 1, wherein the step of affixing the first face includes the step of
heating and pressing the first face using a vacuum bag and a local heat source.

16. The method of claim 1, wherein the step of affixing the first face includes the step of
ironing the first face onto the article surface.

17. The method of claim 1, wherein the method includes the step of
preparing the transfer substrate and optical coating as a plurality of tiles that are each affixed to the article surface in the step of affixing.

* * * * *